(12) United States Patent
Gurer et al.

(10) Patent No.: US 7,625,692 B2
(45) Date of Patent: *Dec. 1, 2009

(54) YIELD AND LINE WIDTH PERFORMANCE FOR LIQUID POLYMERS AND OTHER MATERIALS

(75) Inventors: Emir Gurer, Scotts Valley, CA (US); Ed C. Lee, Cupertino, CA (US); Murthy Krishna, Sunnyvale, CA (US); Reese Reynolds, Los Gatos, CA (US); John Salois, Redwood City, CA (US); Royal Cherry, San Jose, CA (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/595,452

(22) Filed: Nov. 8, 2006

(65) Prior Publication Data
US 2007/0059651 A1    Mar. 15, 2007

Related U.S. Application Data

(62) Division of application No. 11/006,876, filed on Dec. 7, 2004, now Pat. No. 7,208,262, which is a division of application No. 10/664,095, filed on Sep. 16, 2003, which is a division of application No. 09/800,060, filed on Mar. 5, 2001, now Pat. No. 6,669,779, which is a division of application No. 09/221,060, filed on Dec. 28, 1998, now Pat. No. 6,248,171.

(60) Provisional application No. 60/100,738, filed on Sep. 17, 1998.

(51) Int. Cl.
*G03F 7/30* (2006.01)

(52) U.S. Cl. .................. 430/309; 430/311; 430/322; 430/325

(58) Field of Classification Search .............. 430/309, 430/311, 322, 325
See application file for complete search history.

(56) References Cited

U.S. PATENT DOCUMENTS

| | | |
|---|---|---|
| 2,295,522 A | 9/1942 | Shorter |
| 2,501,724 A | 3/1950 | Hughey |
| 2,501,725 A | 3/1950 | Hughey |

(Continued)

FOREIGN PATENT DOCUMENTS

EP    0110558 A    6/1984

(Continued)

OTHER PUBLICATIONS

Translation of Office Action for Japanese Patent Application No. 2003-533328 mailed Nov. 4, 2008, 5 pgs.

(Continued)

*Primary Examiner*—Hoa V Le
(74) *Attorney, Agent, or Firm*—Sterne, Kessler, Goldstein & Fox P.L.L.C.

(57) ABSTRACT

Systems and methods are described for improved yield and line width performance for liquid polymers and other materials. A method for minimizing precipitation of developing reactant by lowering a sudden change in pH includes: developing at least a portion of a polymer layer on a substrate with an initial charge of a developer fluid; then rinsing the polymer with an additional charge of the developer fluid so as to controllably minimize a subsequent sudden change in pH; and then rinsing the polymer with a charge of another fluid. An apparatus for minimizing fluid impingement force on a polymer layer to be developed on a substrate includes: a nozzle including: a developer manifold adapted to supply a developer fluid; a plurality of developer fluid conduits coupled to the developer manifold; a rinse manifold adapted to supply a rinse fluid; and a plurality of rinse fluid conduits coupled to the developer manifold. The developer manifold and the rinse manifold can be staggered so as to reduce an external width of the nozzle compared to a nominal external width of the nozzle achievable without either intersecting the fluid manifold and the another manifold or staggering the fluid manifold and the another manifold. The systems and methods provide advantages including improve yield via reduced process-induced defect and partial counts, and improved critical dimension (CD) control capability.

6 Claims, 10 Drawing Sheets

U.S. PATENT DOCUMENTS

| | | | |
|---|---|---|---|
| 3,204,682 | A | 9/1965 | Teleshefsyy et al. |
| 3,516,607 | A | 6/1970 | Shelor |
| 4,326,553 | A | 4/1982 | Hall |
| 4,457,259 | A | 7/1984 | Samuels |
| 4,507,333 | A | 3/1985 | Baise et al. |
| 4,564,280 | A | 1/1986 | Fukuda |
| 4,576,903 | A * | 3/1986 | Baron et al. ............ 430/331 |
| 4,721,252 | A | 1/1988 | Colton |
| 4,747,541 | A | 5/1988 | Morine et al. |
| 4,872,417 | A | 10/1989 | Kuwahara et al. |
| 4,938,994 | A | 7/1990 | Choinski |
| 5,094,884 | A | 3/1992 | Hillman et al. |
| 5,094,934 | A | 3/1992 | Lazarus et al. |
| 5,127,984 | A | 7/1992 | Hua et al. |
| 5,234,161 | A * | 8/1993 | Harrison et al. ............ 239/1 |
| 5,252,137 | A | 10/1993 | Tateyama et al. |
| D341,418 | S | 11/1993 | Akimoto |
| 5,342,738 | A | 8/1994 | Ikeda |
| 5,374,312 | A | 12/1994 | Hasebe et al. |
| 5,429,912 | A | 7/1995 | Neoh |
| 5,449,405 | A | 9/1995 | Cardinali et al. |
| 5,489,623 | A | 2/1996 | Babb et al. |
| 5,625,433 | A | 4/1997 | Inada et al. |
| 5,643,363 | A | 7/1997 | Hosogaya et al. |
| 5,658,615 | A | 8/1997 | Hasebe et al. |
| 5,678,116 | A | 10/1997 | Sugimoto et al. |
| 5,685,934 | A | 11/1997 | Ikeda et al. |
| 5,720,814 | A | 2/1998 | Takagi et al. |
| 5,769,946 | A | 6/1998 | Kutsuzawa et al. |
| 5,772,764 | A | 6/1998 | Akimoto |
| 5,782,978 | A | 7/1998 | Kinose et al. |
| 5,788,773 | A | 8/1998 | Okuda et al. |
| 5,814,151 | A | 9/1998 | Lee et al. |
| 5,815,762 | A | 9/1998 | Sakai et al. |
| 5,820,677 | A | 10/1998 | Yonaha |
| 5,824,155 | A | 10/1998 | Ha et al. |
| 5,853,961 | A | 12/1998 | Sakai et al. |
| 5,854,953 | A | 12/1998 | Semba |
| 5,885,755 | A | 3/1999 | Nakagawa et al. |
| 5,897,982 | A * | 4/1999 | Shibata et al. ............ 430/311 |
| 5,902,399 | A | 5/1999 | Courtenay |
| 5,904,301 | A * | 5/1999 | Kajiyama et al. ............ 239/549 |
| 5,919,520 | A | 7/1999 | Tateyama et al. |
| 5,939,139 | A | 8/1999 | Fujimoto |
| 6,012,858 | A | 1/2000 | Konishi et al. |
| 6,013,317 | A | 1/2000 | Motoda et al. |
| 6,019,843 | A | 2/2000 | Park et al. |
| 6,033,475 | A | 3/2000 | Hasebe et al. |
| 6,056,998 | A | 5/2000 | Fujimoto |
| 6,062,240 | A | 5/2000 | Sada et al. |
| 6,063,190 | A | 5/2000 | Hasebe et al. |
| 6,159,662 | A | 12/2000 | Chen et al. |
| 6,248,171 | B1 | 6/2001 | Gurer et al. |
| 6,384,894 | B2 | 5/2002 | Matsuyama et al. |
| 6,669,779 | B2 | 12/2003 | Gurer et al. |
| 6,689,215 | B2 | 2/2004 | Nguyen |
| 6,746,826 | B1 | 6/2004 | Park et al. |
| 7,208,262 | B2 | 4/2007 | Gurer et al. |
| 7,255,975 | B2 | 8/2007 | Gurer et al. |
| 2007/0089671 | A1 | 4/2007 | Gurer et al. |

FOREIGN PATENT DOCUMENTS

| | | |
|---|---|---|
| EP | 0794463 A2 | 9/1997 |
| EP | 0829767 A1 | 3/1998 |
| JP | 57198457 A | 12/1982 |
| JP | 58088749 | 6/1983 |
| JP | 58111318 | 7/1983 |
| JP | 59007949 | 1/1984 |
| JP | 59050440 | 3/1984 |
| JP | A 04-124812 | 4/1992 |
| JP | A 05-055133 | 3/1993 |
| JP | 06045244 | 2/1994 |
| JP | 07142344 | 6/1995 |
| JP | 07282476 | 10/1995 |
| JP | 08142534 | 6/1996 |
| JP | 08272083 | 10/1996 |
| JP | 09297403 | 1/1997 |
| JP | 11307433 A | 4/1998 |
| JP | 2000-147787 A | 5/2000 |
| WO | WO 99/53381 | 10/1999 |
| WO | WO 00/16163 | 3/2000 |

OTHER PUBLICATIONS

Final Office Action mailed Oct. 17, 2008 for U.S. Appl. No. 11/604,130, filed Nov. 22, 2006, 8 pgs.

Singer, Peter, "New Frontiers in Spin-On Dielectrics," Semiconductor International, May 1997, pp. 75-76.

Singer, Peter, "Low k Dielectrics: The Search Continues," Semiconductor International, May 1996, pp. 89-90, 94.

Laxman, Ravi K., "Low e Dielectrics: CVD Fluorinated Silicon Dioxides," Semiconductor International, May 1995, pp. 71, 74.

Mertesdorf, Carlo et al., "Structural Design of Ketal and Acetal Blocking Groups in 2-Component Chemically Amplified Positive DUV-Resists," SPIE, vol. 2438, pp. 84-96.

Ito, Hiroshi et al., "Influence of Acid Generator Structure on T-Top Formation in High Temperature Bake Processes for Environmental Stabilization," SPIE, vol. 2438, pp. 53-59.

First Non-Final Rejection mailed Feb. 25, 2008 for U.S. Appl. No. 11/604,130, filed Nov. 22, 2006, 8 pgs.

International Search Report PCT/US99/20115.

* cited by examiner

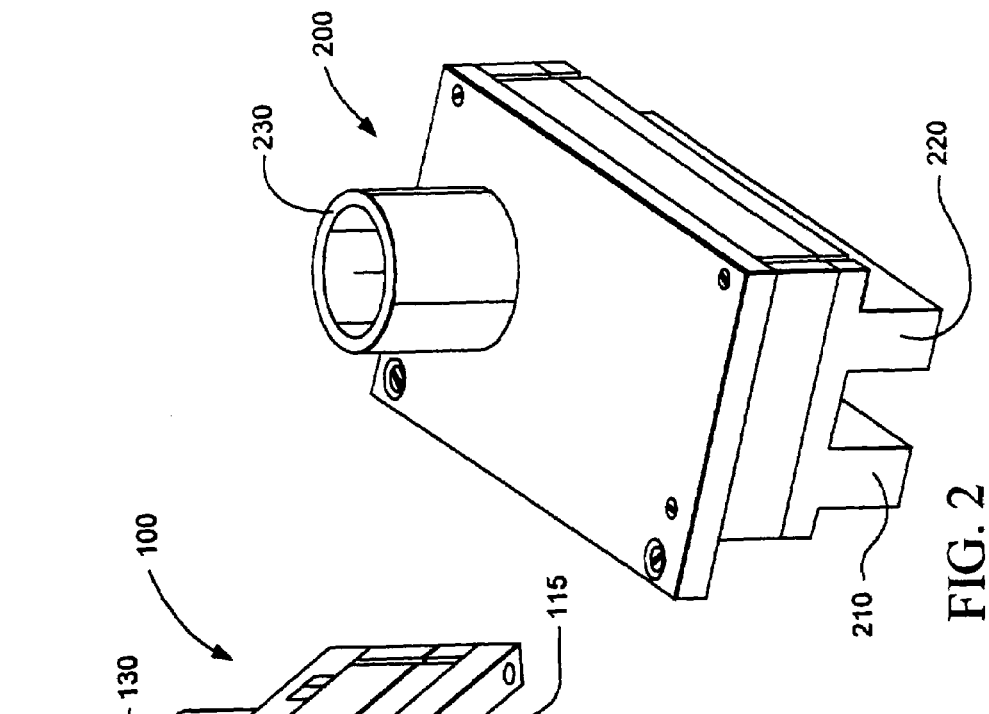
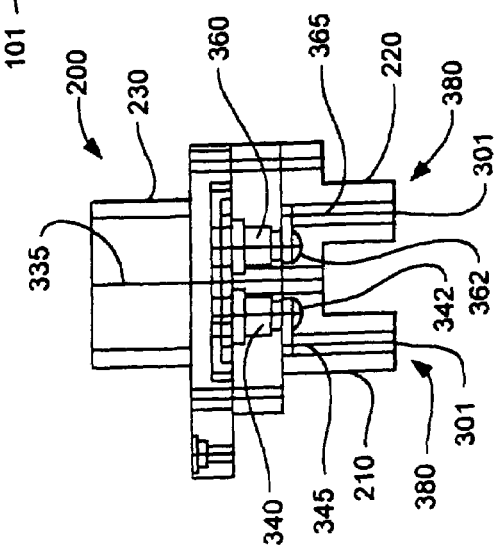

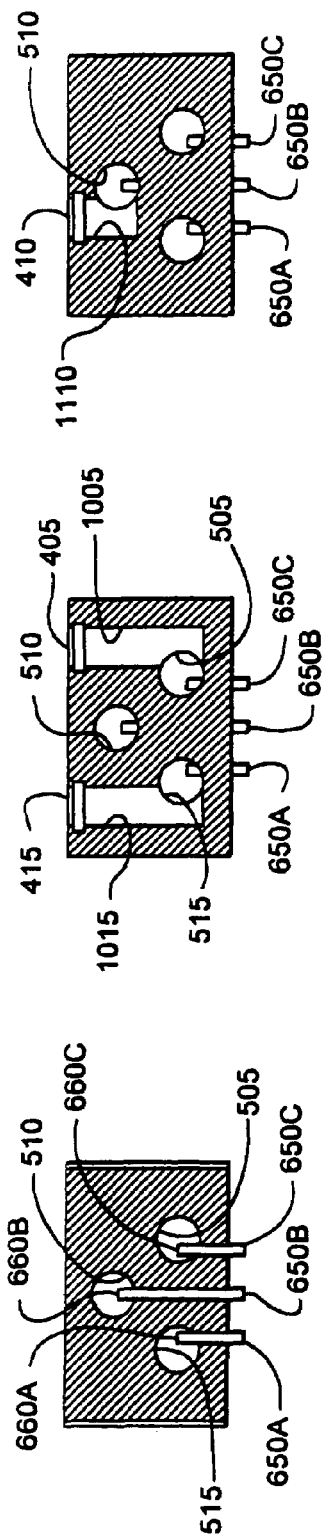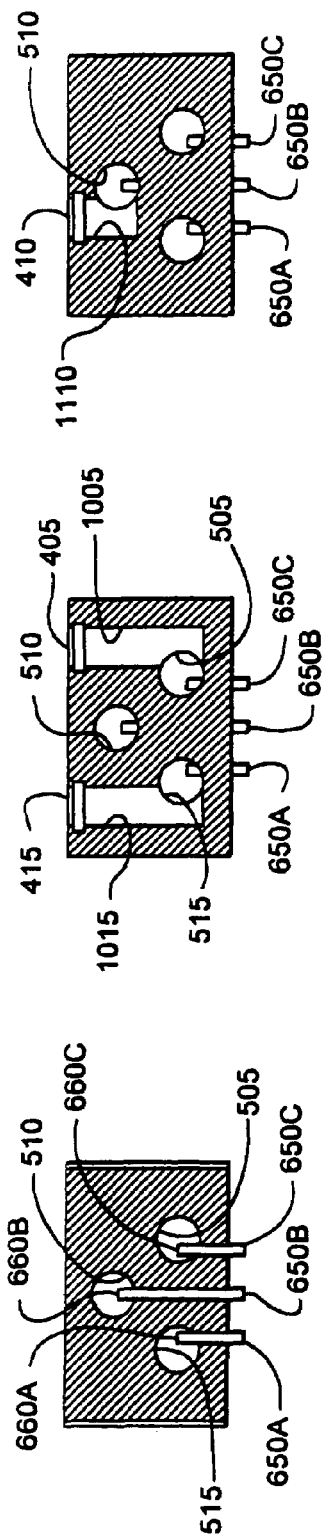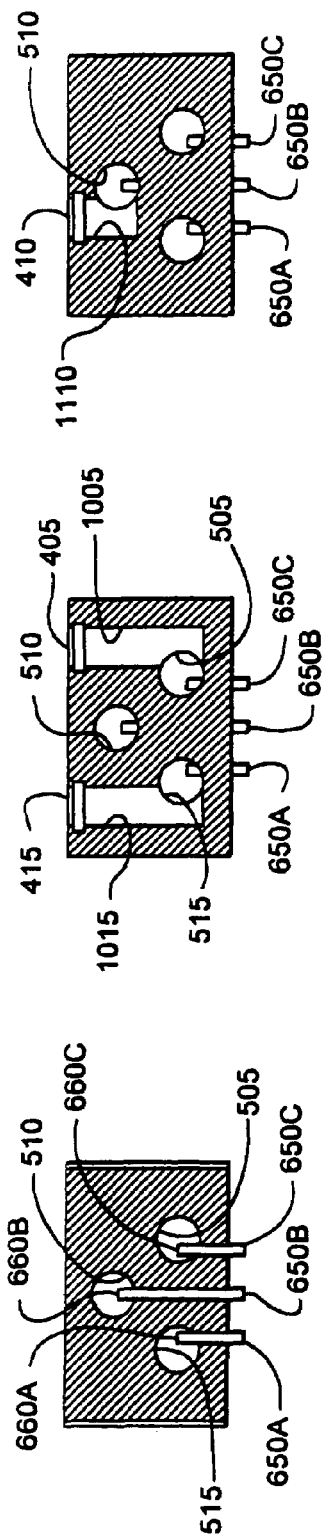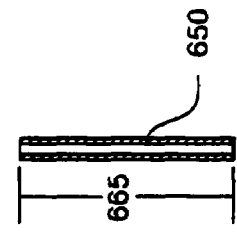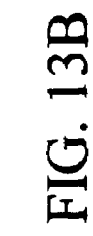

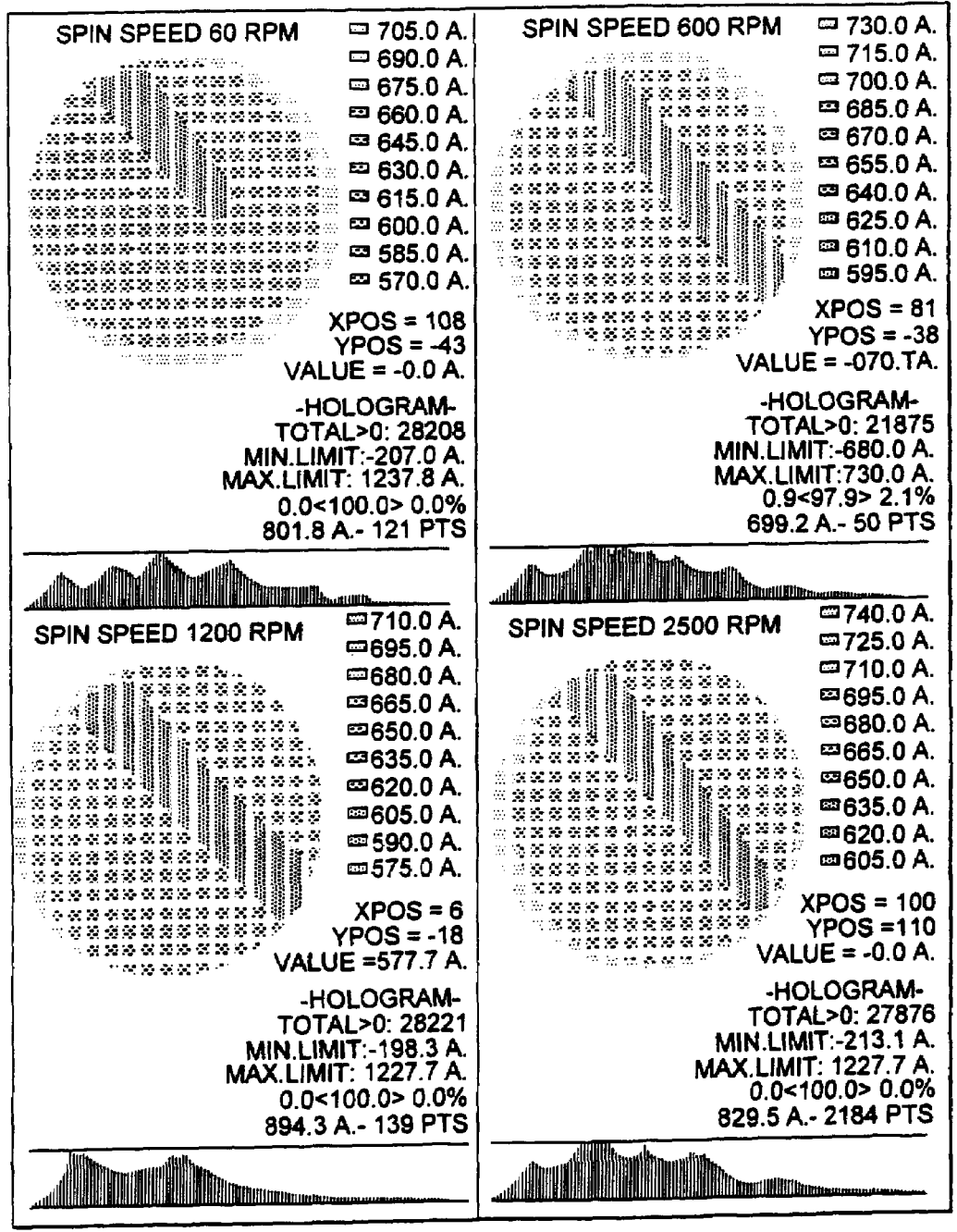

FIG.21A  FIG.21B
IPEC DEVELOP RATE MAPS FOR ARM OFFSET=10mm
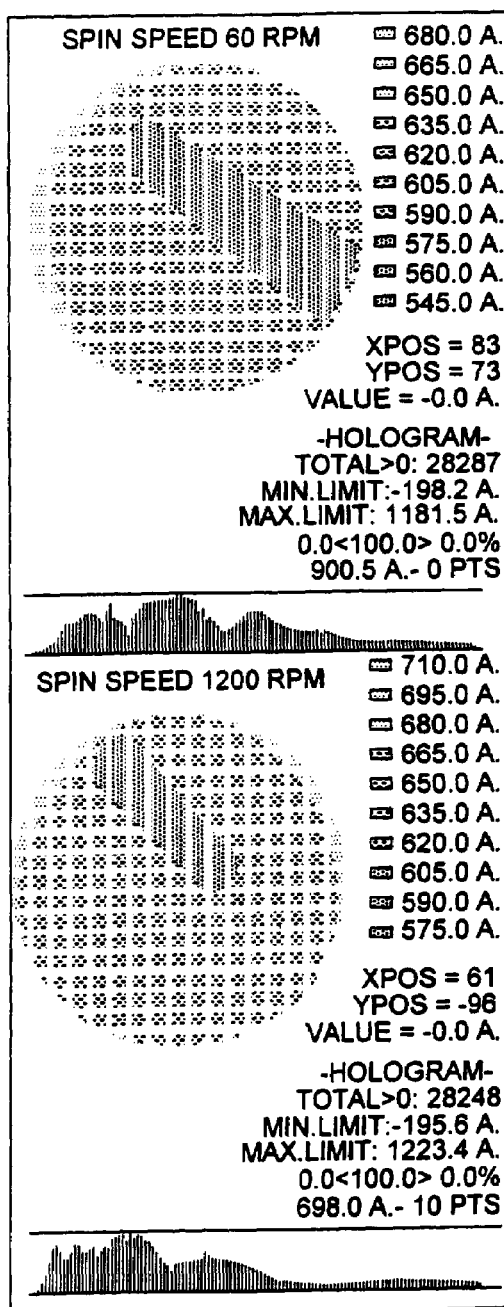
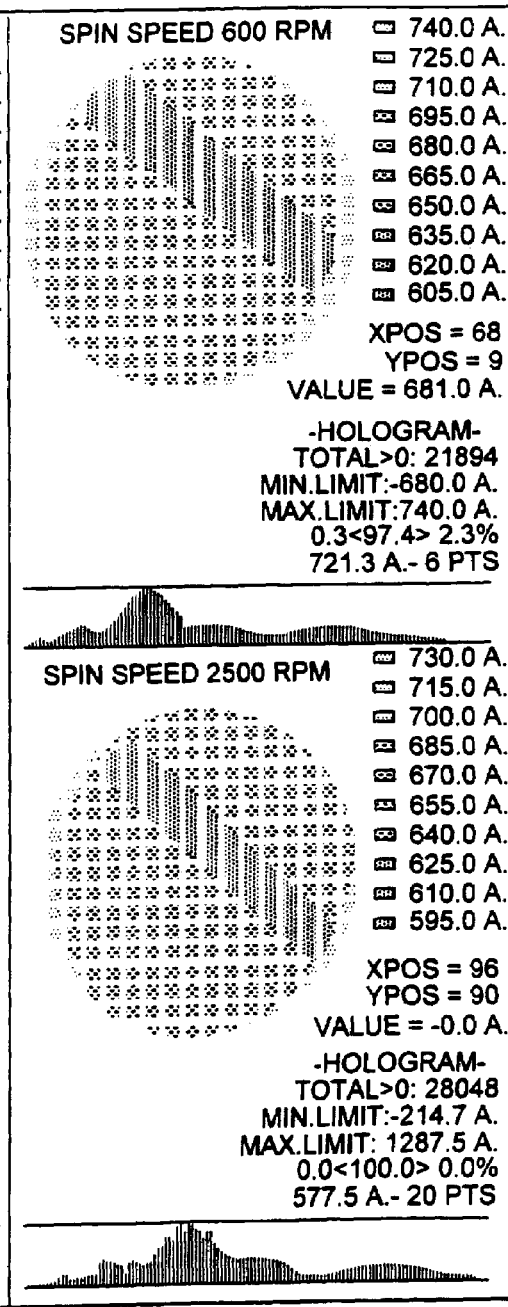
FIG.21C  FIG.21D FIG.22A  FIG.22B
IPEC DEVELOP RATE MAPS FOR ARM OFFSET=20mm
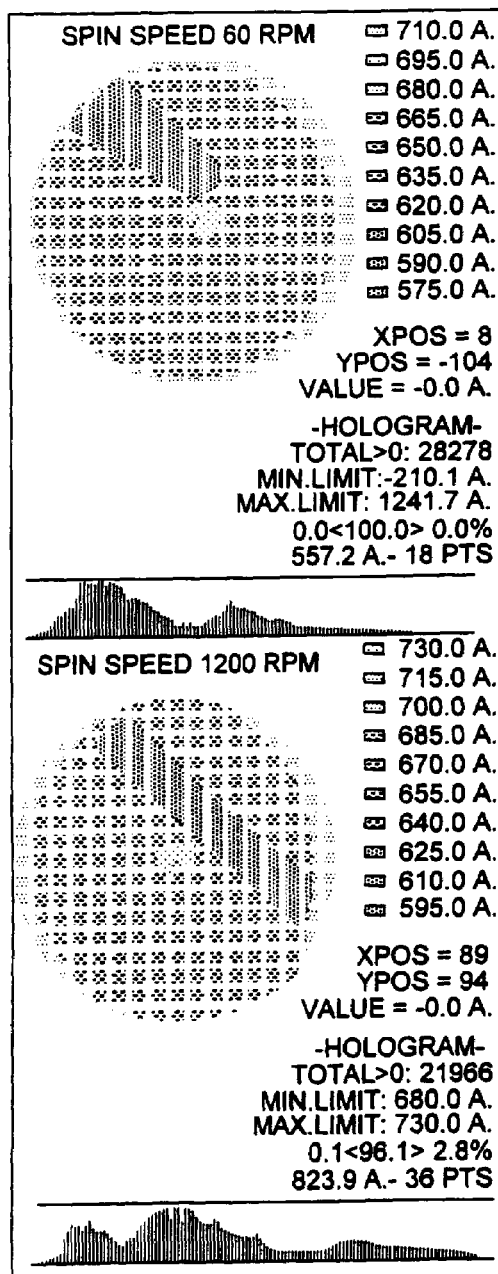
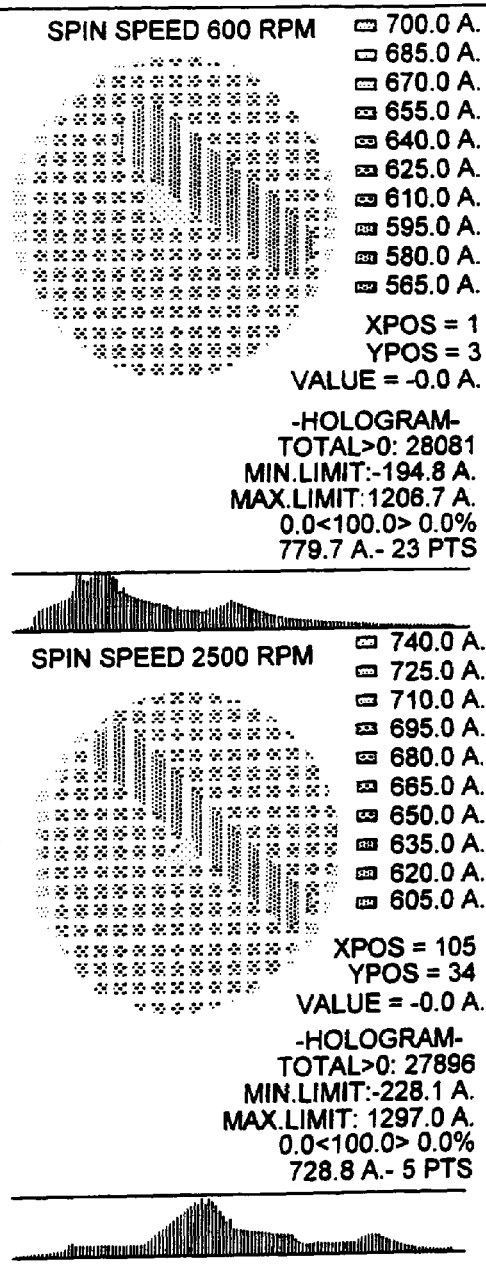
FIG.22C  FIG.22D

_US 7,625,692 B2_

YIELD AND LINE WIDTH PERFORMANCE FOR LIQUID POLYMERS AND OTHER MATERIALS

CROSS-REFERENCE TO RELATED APPLICATION

This application is a Divisional Application of application Ser. No. 11/006,876 filed Dec. 7, 2004 now U.S. Pat. No. 7,208,262, which is a Divisional Application of Ser. No. 10/664,095 filed Sep. 16, 2003, which is a Divisional Application of Ser. No. 09/800,060 filed Mar. 5, 2001, now U.S. Pat. No. 6,669,779, which is a Divisional Application of Ser. No. 09/221,060 filed Dec. 28, 1998, now U.S. Pat. No. 6,248,171 which is a continuation-in-part under 35 USC §120 of U.S. Ser. No. 60/100,738, filed Sep. 17, 1998, the entire contents of which are hereby incorporated herein by reference as if fully set forth herein.

BACKGROUND OF THE INVENTION

1. Field of the Invention

The invention relates generally to the field of microelectronic fabrication. More particularly, the invention relates to improving the yield and line width performance of liquid polymers.

2. Discussion of the Related Art

Lithography process is one of the major drivers of semiconductor industry in its relentless progress in achieving smaller feature sizes with improved yields. More specifically, improved critical dimension (CD) control and reduced process-induced defect and particle counts need to be satisfied simultaneously.

The develop fluid module process plays a significant role in the patterning of increasingly smaller line widths. Regions of high and low dissolution rates are created on the resist film as a result of the sequence of photolithography process steps preceding the develop process. During a develop process, images transferred to the resists film are developed into three dimensional structures by a wet process. The subsequent etch process (mostly dry) transfers this image onto the substrate (Si, SiO$_2$, poly Si, etc.).

There are many variations of a good develop process. In general, a typical develop process has two main parts. In the first part, developer fluid is dispensed over a wafer spinning at a low rpm followed by a static puddle formation and a long static or oscillating step at which regions of high dissolution rate are etched away, creating 3-dimensional images on the film. Quality of patterned images, value of side wall angles and CD control, are all strongly affected by the first part of the develop process. The chemical wet etch step is immediately followed by a deionized (DI) water rinse step whose main function is to wash away dissolved resist and developer fluid mixture with minimum particle and defect count on the patterned wafer. Naturally, the rinse step is extremely crucial in improving yield of a lithography process.

Heretofore, the requirements of improved critical dimension control, reduced process-induced defect counts and reduced process-induced particle counts referred to above have not been fully met. What is needed is a solution that simultaneously addresses all of these requirements.

SUMMARY OF THE INVENTION

A primary goal of the invention is to improve yield. Another primary goal of the invention is improved CD control capability. This invention provides a solution for both of these problems in the developer fluid module of a wafer track tool.

A first aspect of the invention is implemented in an embodiment that is based on a method for minimizing precipitation of developing reactant by lowering a sudden change in pH, said method comprising: developing at least a portion of a polymer layer on a substrate with a charge of developer fluid; then permitting at least a portion of said charge of developer fluid to dwell on said polymer so as to controllably minimize a subsequent sudden change in pH; and then rinsing said polymer with a charge of another fluid. A second aspect of the invention is implemented in an embodiment that is based on a method for minimizing precipitation of developing reactant by lowering a sudden change in pH, said method comprising: developing at least a portion of a polymer layer on a substrate with an initial charge of a developer fluid; then rinsing said polymer with an additional charge of said developer fluid so as to controllably minimize a subsequent sudden change in pH; and then rinsing said polymer with a charge of another fluid. A third aspect of the invention is implemented in an embodiment that is based on a method for minimizing precipitation of developing reactant by lowering a sudden change in pH, said method comprising: developing at least a portion of a polymer layer on a substrate with a charge of developer fluid; then contacting said substrate with a charge of buffer, thereby mixing at least a portion of said developer fluid with at least a portion of said charge of buffer, so as to controllably minimize a subsequent sudden change in pH; and then rinsing said polymer with a charge of another fluid.

A fourth aspect of the invention is implemented in an embodiment that is based on an apparatus for minimizing fluid impingement force on a polymer layer to be developed on a substrate, thereby improving yield and line width control performance, said apparatus comprising: a nozzle including: a manifold adapted to supply a fluid; a plurality of fluid conduits coupled to said manifold; and a plurality of tubular inserts located within said plurality of fluid conduits. A fifth aspect of the invention is implemented in an embodiment that is based on an apparatus for minimizing fluid impingement force on a polymer layer to be developed on a substrate, thereby improving yield and line width control performance, said apparatus comprising: a nozzle including: a developer manifold adapted to supply a developer fluid; a plurality of developer fluid orifices coupled to said developer manifold; a rinse manifold adapted to supply a rinse fluid; and a plurality of rinse fluid orifices coupled to said developer manifold, wherein said developer manifold and said rinse manifold are staggered to reduce an exterior width of said nozzle. A sixth aspect of the invention is implemented in an embodiment that is based on an apparatus for minimizing fluid impingement force on a polymer layer to be developed on a substrate, thereby improving yield and line width control performance, said apparatus comprising: a nozzle including: a developer manifold adapted to supply a developer fluid; a plurality of developer fluid orifices coupled to said developer manifold; a rinse manifold adapted to supply a rinse fluid; a plurality of rinse fluid orifices coupled to said rinse manifold, and said plurality of rinse fluid orifices arranged to define at least one rinse fluid axis, wherein said nozzle is connected to a bracket adapted to raise and lower said nozzle with regard to said substrate and reposition said at least one rinse axis so as to be substantially coplanar with a normal to a center of said substrate.

These, and other, goals and aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters (if they occur in more than one view) designate the same parts. It should be noted that the features illustrated in the drawings are not necessarily drawn to scale.

FIG. 1 illustrates a bottom perspective view of a multiport nozzle, representing an embodiment of the invention.

FIG. 2 illustrates a top perspective view of a multiport nozzle, representing an embodiment of the invention.

FIG. 3 illustrates a sectional view of the multiport nozzle shown in FIG. 2.

FIG. 9 illustrates a sectional view of the multiport nozzle shown in FIG. 4 taken along section line B-B.

FIG. 10 illustrates a sectional view of the multiport nozzle shown in FIG. 4 taken along section line C-C.

FIG. 11 illustrates a sectional view of the multiport nozzle shown in FIG. 4 taken along section line D-D.

FIG. 12A illustrates an end view of a nozzle insert, representing an embodiment of the invention.

FIG. 12B illustrates a sectional view of the nozzle insert shown in FIG. 12A taken along section line F-F.

FIG. 13A illustrates an end view of a nozzle insert, representing an embodiment of the invention.

FIG. 13B illustrates a sectional view of the nozzle insert shown in FIG. 13A, taken along section line E-E.

FIGS. 19A-19D illustrate develop rate as a function of spatial position on the substrate for a developer axis offset of 0 mm, representing an embodiment of the invention.

FIGS. 21A-21D illustrate develop rate as a function of spatial position on the substrate for a developer axis offset of 10 mm, representing an embodiment of the invention.

FIGS. 22A-22D illustrate develop rate as a function of spatial position on the substrate for a developer axis offset of 20 mm, representing an embodiment of the invention.

DESCRIPTION OF PREFERRED EMBODIMENTS

Figure 5:
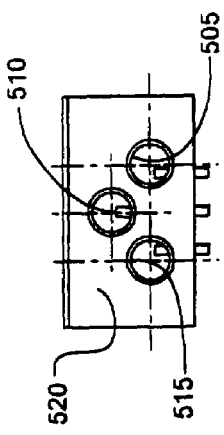
FIG. 5 illustrates an end view of the multiport nozzle shown in FIG. 4.

The invention and the various features and advantageous details thereof are explained more fully with reference to the nonlimiting embodiments that are illustrated in the accompanying drawings and detailed in the following description of preferred embodiments. Descriptions of well known components and processing techniques are omitted so as not to unnecessarily obscure the invention in detail.

The context of the invention includes photolithography processing of micro structures (e.g., microelectronic structures). These structures are typically etched and the polymers of interest function as masks to shield portions of the structures that are to remain at least largely unaffected by the etchant. The polymers that are being developed can be negative and/or positive photoresists. The invention can also utilize data processing methods that transform signals that characterize the state of the polymer processing so as to actuate interconnected discrete hardware elements; for example, to reposition the nozzle or change the spin rate.

The invention includes reducing defect density during the develop process of a liquid polymer used in a photolithography step by employing a new multiport delivery apparatus (nozzle). An important aspect of the multiport delivery apparatus is reducing droplet impact. This delivery system resides in a developer fluid module in which uniform laminar air flow field exists as a prerequisite. This apparatus allows significant reduction of the defect density due to its superior rinsing action. In addition, this multiport nozzle system allows two different developer fluid chemistries (in addition to a rinse chemistry) to be supported without any cross contamination. This delivery system for both developer fluid and deionized water reduces the impact force of the liquid(s) thus preventing pattern collapse which is a significant yield management problem for small feature sizes.

The invention can be part of a developer fluid module of a wafer track tool. In this application, the invention can be classified as involving 1) multiport nozzle system which supports the dispense of two different developer fluid fluids without any cross-talk, 2) a second multiport nozzle system of same or similar geometry which is used for the dispense of the deionized water during the rinse step, 3) implementing either parts 1) or 2) to support dual chemistry developer fluid as well as low impingement requirement throughout the develop process. The invention includes reducing the critical dimension (CD) variation contribution of the developer fluid module by distributing the developer fluid over the exposed wafer uniformly. This improves the overall CD control capability of a wafer track system when it includes such an apparatus in its developer fluid module. The track system can be coupled to a stepper. The term coupled, as used herein, is defined as connected, although not necessarily directly, and not necessarily mechanically.

The invention includes helping prevent collapse of developed resist structure or structures and it includes reducing a sudden change in pH. The term sudden, as used herein to characterize a change in pH, is defined as a change in pH with respect to time that includes two inflection points separated by a period of time of less than approximately 1 second, preferably less than approximately 0.1 second, and more preferably less than approximately 0.01 seconds. Such a nearly congruent occurrence of two inflection points can be termed a step function.

This invention includes many designs for a multi-port nozzle that can be used to deliver both developer fluid and deionized water over a polymer layer to be developed on a substrate. The nozzle provides a geometry of outlets that are arranged to provide an optimal spatial liquid flow rate while minimizing dripping. The invention includes helping to prevent collapse of developed resist structure or structures by reducing impact force of the liquid on the film. The invention includes providing a multiport nozzle with a nozzle insert in at least one of the ports. The inserts can be made of a material that has a low coefficient of friction (either static or dynamic) with respect to the working fluid of the nozzle.

The invention includes extending the inserts beyond the material in which they are located. This extension can be internal, whereby the inserts extend into the input manifold. The extensions can be external, whereby the inserts extend beyond the bottom of the body of the nozzle.

An advantage of extending the inserts is to permit the internal manifold to function as an air equalized reservoir, thereby affecting an equalization of static pressure with respect to the ports. An advantage of extending the inserts externally is to prevent accumulation of residual working fluid on the bottom surface of the body of the nozzle, notwithstanding any operational attempts to mitigate such residual accumulation by reversing the working fluid pressure to achieve suck-back.

The invention includes staggering the working fluid manifolds. By staggering the working fluid manifolds, the principle axes of the manifolds can be brought closer together than would otherwise be permitted by a non-staggered, non-intersecting configuration of the inner section of radial bores. An advantage of staggering the manifolds is that the overall width of the multiport nozzle becomes narrower. Staggering the manifolds is useful even if there are only two manifolds, especially where the volume defined by the extent of the manifold is increased due to the functional requirements of static pressure equalization among the ports.

The invention includes a single nozzle head that dispenses two develop fluids having distinct chemistries, and one rinsing deionized water (DI) chemistry through rows of holes that are strategically placed so that all dispensing can be done with one head position. This allows use of a rotary cylinder actuator for head motion from a drain location to a single dispense location. No servo positioning control is required. The DI row of holes is centered for rinse of the entire wafer. The developer chemistry rows are preferably placed 5 mm offset because process data discussed below in more detail indicates that a 5 mm develop chemistry offset actually improves process results. The dispense holes can have pressed in tubes with small radius ends. There are at least two qualities of these tubes that provide benefits. First, small radius ends provide no surface that would allow liquid to cling. Any liquid clinging at this bottom surface can cause dispensing streams to be pulled off center. Also, liquid on the bottom, horizontal surface can cause two streams to join into one larger stream. This is especially problematic when it is critical that there is no contamination between the different chemistries on the head. Second, forming the tips to be radial edges or ends, as with pressed in tubes, allows a very smooth inner surface and eliminates aberrations that cause fluid clinging. Miniscule surface aberrations can cause streams to be misdirected. Rough surfaces cause uncontrolled liquid clinging which can lead to chemistry drying and contamination. The chance of sucking back a bubble is decreased since liquid-air interface shape is well controlled. The "plenum" bore positions are staggered to allow 5 mm offset of developer to be maintained and allow three chemistry rows on a 1.5" wide head. All holes are strategically placed so that the dispense head is one piece.

FIG. 1 illustrates an embodiment of a multipart nozzle 100 for dispensing a single chemistry fluid. The nozzle 100 may have a maximum width measured from a front face 105 to a back face equal to the radius of the wafer receiving the fluid. The nozzle 100 includes a main arm 110 having a plurality of conduits aligned along a vertical axis with respect to a bottom face 115 of the nozzle 100. An inlet manifold 130 receives an intake fluid, and the fluid is then distributed through the nozzle and onto a rotating wafer via a plurality of outlets 101. In this embodiment, the outlets 101 are shown to align linearly across the width of the main arm 110. The width of the nozzle 100 allows the dispensed fluid to cover the whole wafer in one full rotation of the wafer. As such, the nozzle 100 provides a uniform and fast distribution of the fluid, which for developing fluid applications is a crucial requirement for improved CD control.

FIG. 2 shows another embodiment of the present invention where a multipart nozzle 200 includes an intake manifold 230 for receiving either one fluid or two fluids having distinct chemistries. The fluid from the inlet manifold may be distributed between a first arm 210 and a second arm 220. Each arm 210, 220 may have distinct or identical arrangement of outlets 301 (shown in FIG. 3) depending on the application of the nozzle 200. The nozzle 200 may also have a width between a front face 205 and a back face equal to the diameter of the wafer, thereby allowing the dispensed fluid to cover the whole wafer in one full rotation of the wafer FIG. 3 is a cross-sectional view of the nozzle 200, showing the inlet manifold 230 being divided to preferably receive two fluids having distinct chemistries, such as developing fluid and deionized water. A partition 335 divides the fluid streams in the inlet manifold 230. FIG. 2 shows the inlet manifold 230 guiding one fluid stream into a first inlet channel 340. The first inlet channel 340 includes a bend 342 that merges with a conduit 345 in the first arm 210. The manifold guides another fluid stream into a second inlet channel 360. The second inlet channel 360 includes a bend 362 that merges with a second tubular insert 365 in the second arm 220. Preferably, the outlets 301 on a bottom face 380 of the nozzle 200 are aligned linearly across the width of the nozzle 200, although alternative arrangements are possible and will be further described. The configuration of the nozzle 200 accommodates the use of two different developer fluid chemistries with temperature control without any cross contamination during dispensing. The nozzle 200 may be adapted to allow for deionized water dispensing, with or separately from developing fluid dispensing. However, the nozzle 200 of or a similar variation thereto, may also be integrated into a single or dual chemistry version of the developer fluid.

Another important feature of this invention is that the impingement force of this nozzle is significantly reduced as compared to a single hole nozzle due to its multi-port nature. The reduced impact force is important for smaller CD sizes that tend to have high aspect ratios. This makes them vulnerable to pattern collapse due to impact of the fluid. Embodiments of this invention reduce impact forces for the developer fluids and the deionized water. This as such, the impingement forces throughout the develop process, may be minimized thus ensuring a reliable method of patterning smaller feature sizes with higher yield than that provided by the know art. Another significant advantage of the multiport nozzle for use with both developer fluid and deionized water is that it increases process latitude. In addition, the improved liquid delivery and distribution capability of the multiport nozzle ensures better overall process compliance for mechanical process variables such as spin speed and fluid dispensing rate. Therefore, another added advantage provided by this invention is the potential to reduce the total develop process time while maintaining CD control as well as good defect and particle performance.

Figure 4:
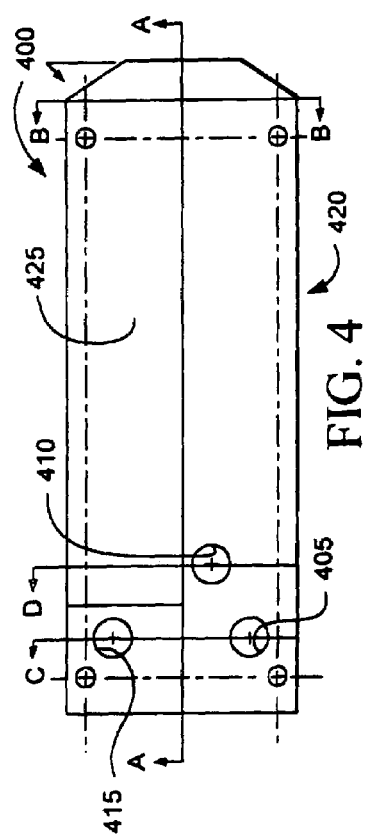
FIG. 4 illustrates a top view of a multiport nozzle, representing an embodiment of the invention.

FIG. 4 illustrates another embodiment of the invention in which a multiport nozzle 400 may dispense either one or two developing fluids, and/or deionized water. Preferably, the nozzle 400 dispenses two developing fluids and deionized water so that all dispensing may be accomplished by positioning the nozzle 400 in just one position. A head 420 of the nozzle 400 includes a top surface 425 having three inlets or inlet manifolds for receiving dispensing fluids and/or deionized water. In FIG. 4, one preferred arrangement provides for a first inlet 405 for a first developing fluid, a second inlet 410 for deionized water, and a third inlet 415 for a second developing fluid. Preferably, two or more of the inlets are staggered with respect to the top surface 425 to conserve space and reduce the overall size of the nozzle 400. In FIG. 4, the first inlet 405 may be staggered from the third inlet 415, with the second inlet centrally located and/or offset between the first inlet 405 and the third inlet 415. FIG. 5 shows an end surface 520 of the head 420 with internal manifolds shown as bored chambers that correspond to the inlets. Preferably, the end surface 520 includes a first manifold 505 merged with the first inlet 405 for the first developing fluid, a second manifold 510 merged with the second inlet 410 for deionized water, and a third manifold 515 merged with the third inlet 415 for a second developing fluid. To further reduce the dimensions of the nozzle, two or more of the manifolds may be staggered with respect to one another across the end surface. Preferably, the first manifold 510 is centrally located on the end face 520, with the second manifold 510 and third manifold 515 symmetrically distributed on either side of the first manifold 505 in triangular fashion.

Figure 6:
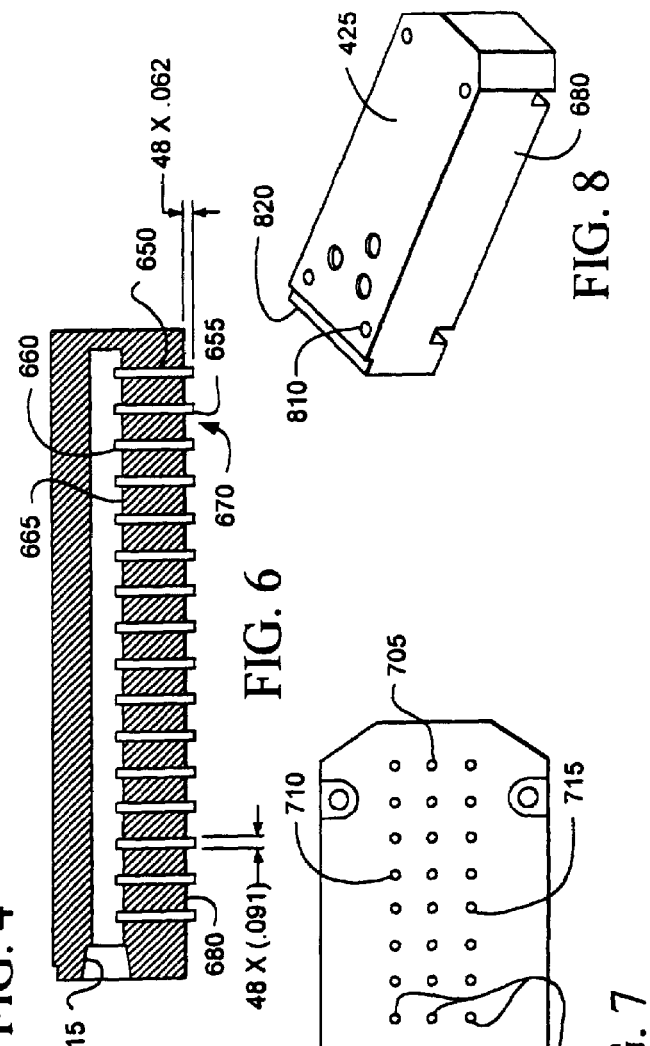
FIG. 6 illustrates a sectional view of the multiport nozzle show in FIG. 4 taken along section line A-A.

FIG. 6 is a cross-section cut along line A-A of FIG. 4, showing as an example the third manifold 515 to include a plurality of conduits 670 which bore vertically through the bottom surface 680 along a vertical axis. The structure of the third manifold 515 is preferably identical to the first and/or second manifolds 505, 510 and will be described in greater detail as a representation of the entire embodiment. As exemplified for the third manifold 515, each of the conduits 670 may include a tubular insert 650 having an internal end 660 and an external end 655. Preferably, the internal end 660 of each tubular insert 650 extends a height internally into the third manifold 515. Fluid entering the third manifold 515 will not drain unless the level of the fluid compiled within the third manifold 515 exceeds the height of the internal end 660. As such, the internal ends 660 may define a reservoir having a depth defined from the internal end 660 of the tubular insert 650 to a bottom manifold surface 665. In this manner, the height of the internal end 660 may also be used to maintain the static pressure within the third manifold 615 constant or equal with respect to the corresponding fluid conduit 670. Likewise, the external ends 655 of the insert tubes 650 may extend beyond the bottom surface 680 of the nozzle 400.

The tubular inserts 650 may be formed to provide a very smooth internal surface that minimizes or eliminate surface flaws which may otherwise misdirect a stream of developing fluids or deionized water. The smooth surface the tubular inserts 650 also avoid the sucking back of bubbles, since the liquid-air interface within the tubular inserts 650 may be controlled. The tubular inserts 650 also provide thin radial edges both inside the manifolds and outside of the nozzle which reduce the area of the tubular inserts that may contact the fluids passing through. This enables the nozzle 400 to avoid problems associated with fluid streams of developing fluids and/or deionized water that contact conduits, such as fluid clinging or other problems that cause streams to pull of center. In addition, the external ends 655 extend sufficiently beyond the nozzle 400 to avoid streams being pulled together on the bottom surface 680.

Figure 7:
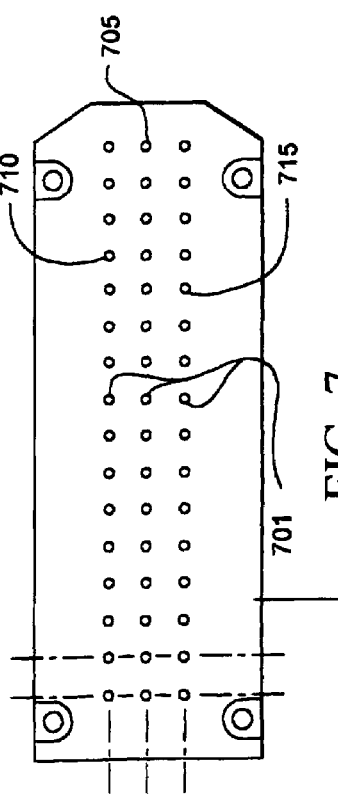
FIG. 7 illustrates a bottom view of the multiport nozzle shown in FIG. 4.

FIG. 7 illustrates a preferred arrangement of outlets on the bottom surface 680 of the nozzle 400. The outlets may be arranged linearly as shown, or staggered to conserve real estate. In an embodiment, a center row 705 of outlets 701 distributes deionized water so that the entire wafer being treated may be rinsed. A second and third row 710 and 715 of outlets 701 may be coupled to the second manifold 510 and the third manifold 515 respectively to dispense at least one, and preferably two, developing fluids.

Figure 8:
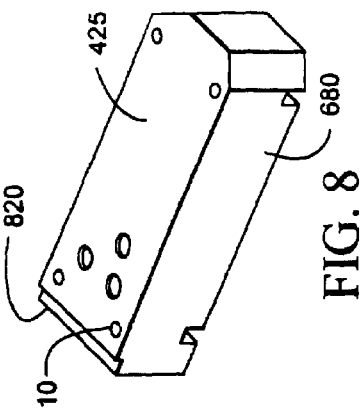
FIG. 8 illustrates a top perspective view of the multiport nozzle shown in FIG. 4.

FIG. 8 illustrates a perspective view of the nozzle 400 incorporating staggered or offset inlets 405, 410, 415. The nozzle 400 may include pivotable mounting brackets 810 on a first longitudinal end 820 for securing the nozzle to an arm or stand above a wafer. The nozzle is also compact, with a preferred vertical height extending from the top surface 425 to the bottom surface 680 of 1.5 inches. The nozzle 400 may include pivotable mounting brackets 810 on a first longitudinal end 820 for securing the nozzle to an arm or stand above a wafer. The nozzle is also compact, with a preferred vertical height extending from the top surface 425 to the bottom surface 680 of 1.5 inches.

FIG. 9 is a cross-section of the nozzle 400 taken along lines B-B of FIG. 4. The nozzle 400 is shown in FIG. 9 to include the first manifold 505 coupled to a first plurality of tubular inserts 650a. Likewise, the second manifold 510 is coupled to a second plurality of tubular inserts 650b, and the third manifold 515 is coupled to a third plurality of tubular inserts 650c. Each of the first, second, and third tubular inserts 650a, 650b, 650c preferably extend inwards into the respective first, second, and third manifold 505, 510, 515 so that the inward extensions 660a, 660b, 660c of each tubular inserts 650 define a reservoir with the corresponding manifolds. The height of each reservoir within the manifolds 505, 510, and 515 may be individually set by the length of the respective inward extensions 660a, 660b, 660c, as described in FIGS. 12 & 13 and the accompanying text.

FIG. 10 is a cross-section of the nozzle 400 taken along lines B-B of FIG. 4. As shown by FIG. 10, each inlet may be coupled to a manifold using one or more chambers associated with or forming a part of the manifold. In particular, FIG. 10 shows the first inlet 405 is coupled to the first manifold 505 with a first inlet chamber 1005, and the third inlet is coupled to the third manifold 515 with a third inlet chamber 1015. FIG. 11 is a cross-section of the nozzle 400 taken along lines B-B of FIG. 4. As with the other inlets and manifolds, FIG. 11 shows the second inlet 410 may couple to the second manifold 510 with a second inlet chamber 1110. In other embodiments, additional inlets may couple to corresponding manifolds using similar configurations, including chambers. FIGS. 10 and 11 also provide another perspective of the tubular inserts 650a, 650b, 650 extending from the bottom surface 680 of the nozzle 400 to avoid combining streams stemming from different manifolds.

FIGS. 12A and 12B illustrate one embodiment for a tubular inserts 650 for use with this invention. As shown by FIG. 12A, the tubular inserts may include a round cross-section 1210. However, other embodiments of the invention may use non-circular cross-sections, including square or polygonal geometries. The height of the tubular insert 650 may be set by either the vertical position of the manifold that retains the tubular insert, or the desired depth of the reservoir defined by the internal end 660 of the tubular insert. FIG. 12A shows the tubular insert 650 having a shorter height for manifolds that are closer the bottom surface 680, such as the first manifold 505 or the third manifold 515. Alternatively, the tubular insert of FIG. 12A may be used to define a shallow reservoir within the second manifold 510.

FIGS. 13A and 13B illustrate another embodiment for tubular inserts. As with the previous embodiment, the tubular insert of FIG. 13A includes a rounded cross-section. The longer length of the tubular insert shown in FIG. 13B is preferred for a manifold that is distanced from the bottom surface 680 with respect to the other manifolds. As such, the tubular insert 650 of FIG. 13A is preferred for the second manifold 510. The tubular insert of FIG. 13B may also be used to create a deeper reservoir within the first manifold 505 or the third manifold 515. For an optimal nozzle having a depth of 1.5 inches, the tubular insert 650 may range between 0.352 inches and 0.665 inches, as shown by FIGS. 12B and 13B.

Figure 14:
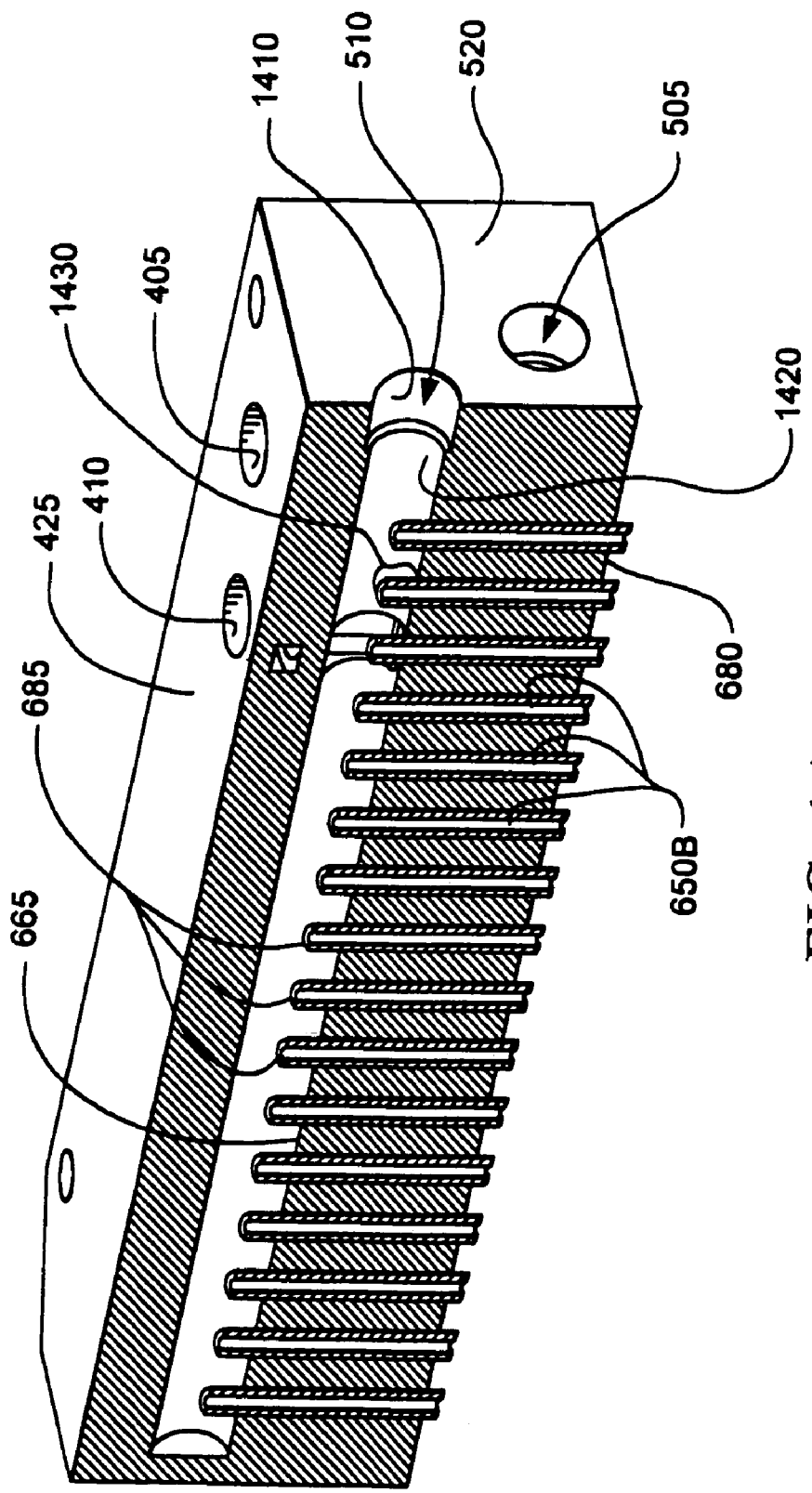
FIG. 14 illustrates a perspective sectional view of the multiport nozzle shown in FIG. 4, taken along section line A-A.
Figure 15:
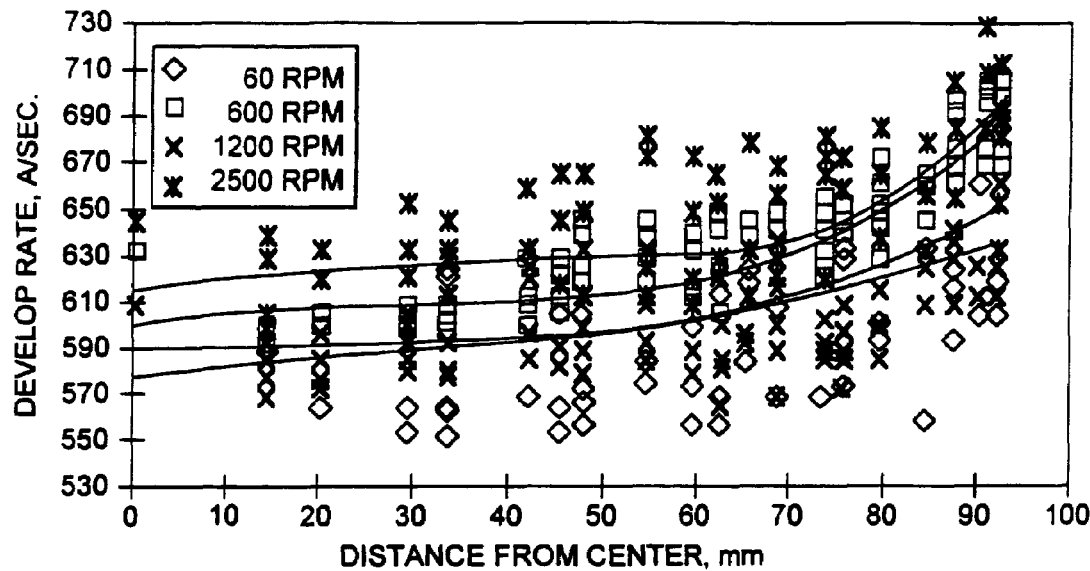
FIG. 15 illustrates develop rate as a function of the distance from the center of the substrate for a developer axis offset of 0 mm, representing an embodiment of the invention.
Figure 16:
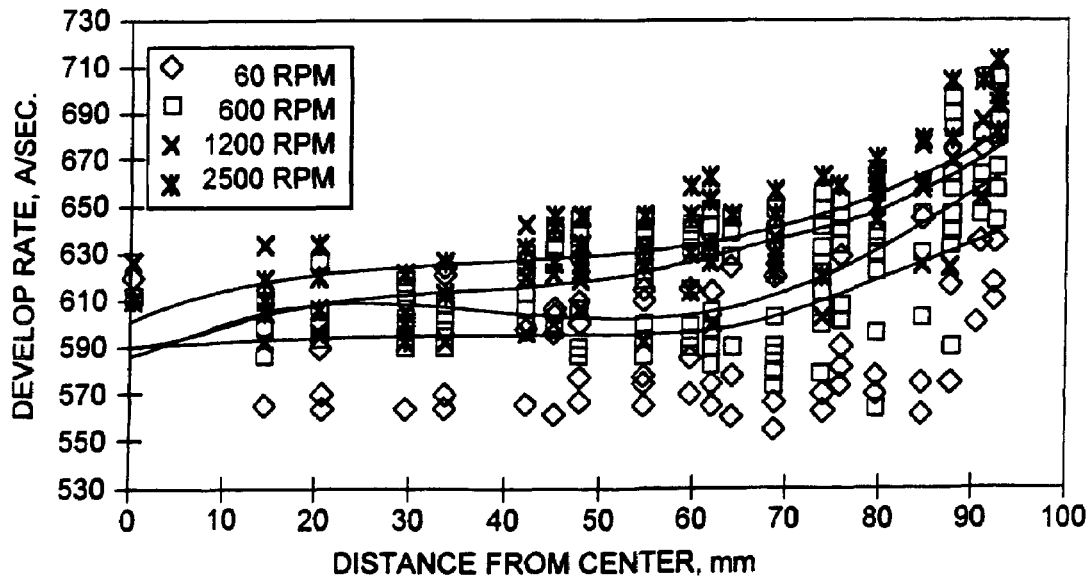
FIG. 16 illustrates develop rate as a function of the distance from the center of the substrate for a developer axis offset of 5 mm, representing an embodiment of the invention.
Figure 17:
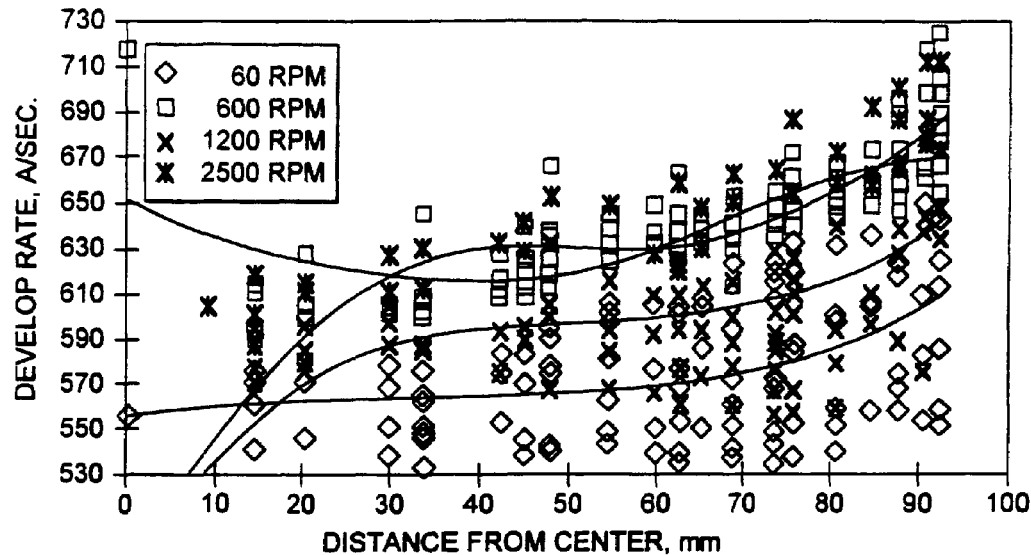
FIG. 17 illustrates develop rate as a function of the distance from the center of the substrate for a developer axis offset of 10 mm, representing an embodiment of the invention.
Figure 18:
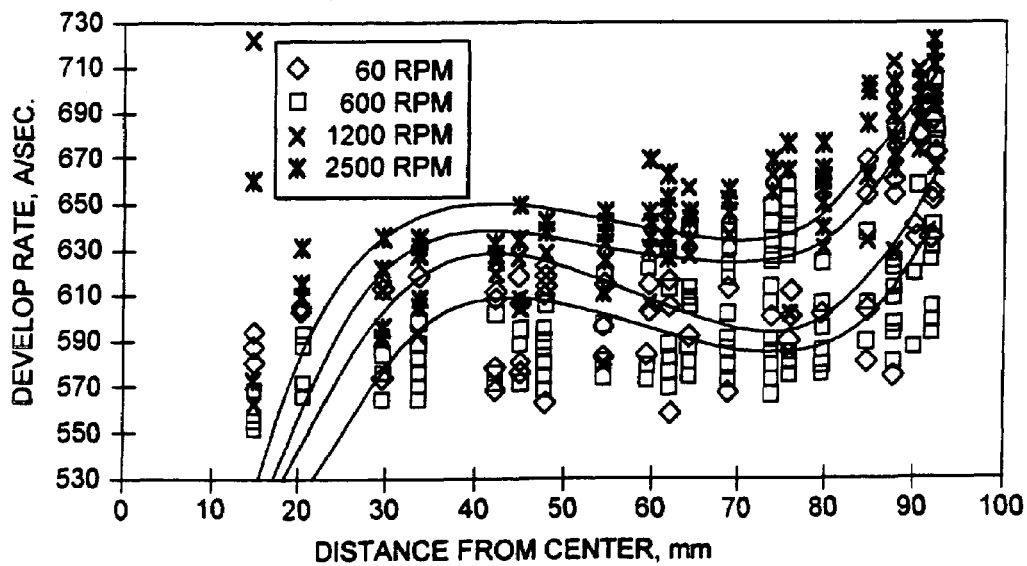
FIG. 18 illustrates develop rate as a function of the distance from the center of the substrate for a developer axis offset of 20 mm, representing an embodiment of the invention.
Figures 20A, 20B, 20C, 20D:
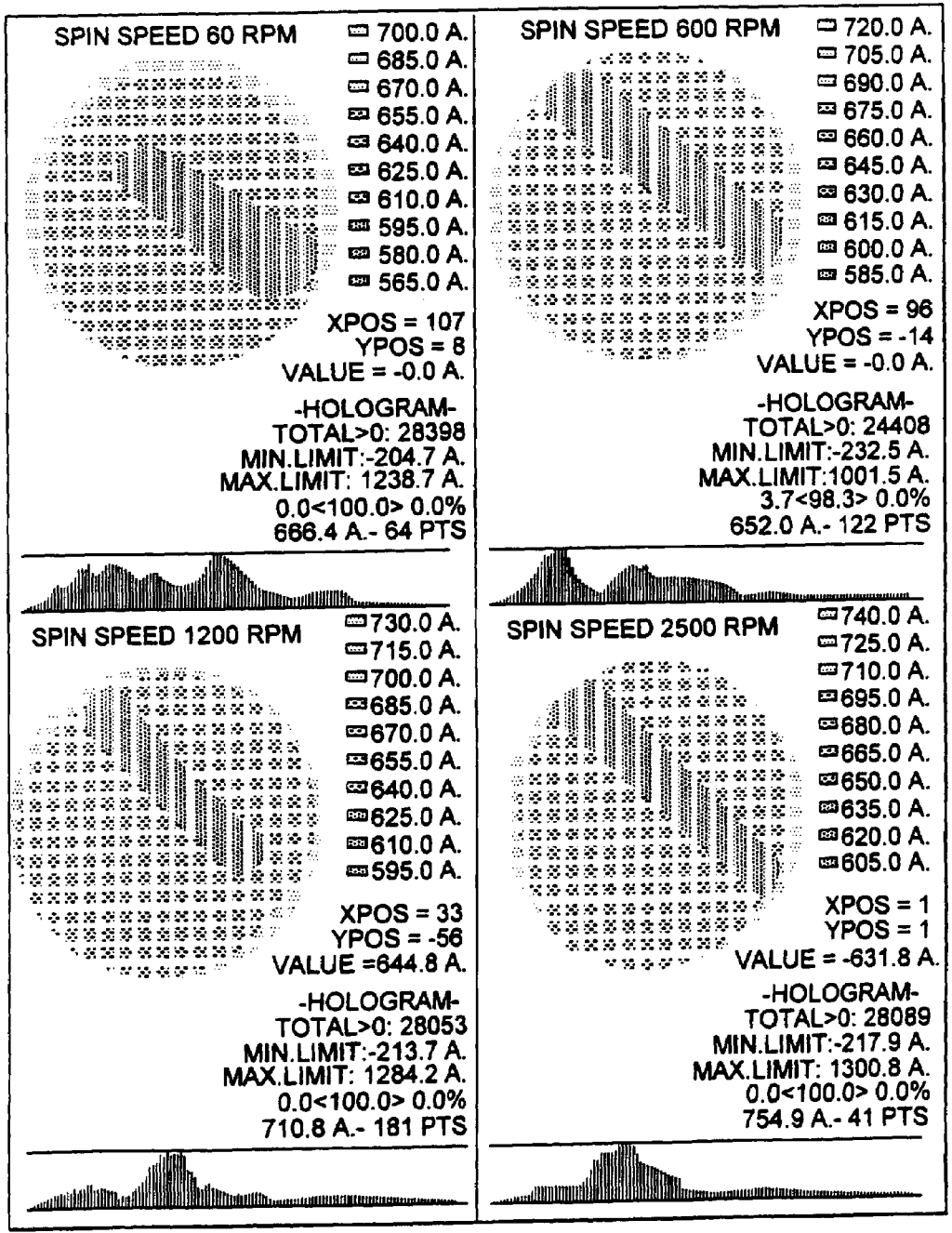
FIGS. 20A-20D illustrate develop rate as a functional of spatial position on the substrate for a developer axis offset of 5 mm, representing an embodiment of the invention.

FIG. 14 is a perspective cross-section of the nozzle 400. The first inlet 405 and the second inlet 410 are shown in an off-center or staggered arrangement on the top surface 425 of the nozzle 400. The end face 520 includes the first manifold 505 and the second manifold 510. The second manifold 510 may, for this embodiment, be viewed as exemplary for other manifolds in this embodiment, and will be described in greater detail. The second manifold 510 includes an enlarged chamber 1410. The enlarged chamber 1410 merges with a bored segment 1420 forming the remainder of the second manifold 510. The second inlet chamber 1010 couples second inlet 410 with the second manifold 510. The tubular inserts 650b extend through the conduits 670 so that the exterior end 655 extends beyond the bottom surface 680. Similarly, the interior end 660 forms a height 1430 over the second manifold bottom surface 665 that defines a depth of the reservoir for when the second manifold 510 receives fluid. In this way, fluid such as deionized water may be received through the second inlet 410 and expand through the bored segment 1420 of the second manifold 510. Prior to the level of the fluid exceeding the height 1430, the fluid forms a reservoir within the second manifold 510. Once the fluid passes the height 1430, fluid enters the tubular insert 650b through the interior end 660 and passes through and out of the exterior end 655. The resulting outflow of the nozzle 400 may, in the case of deionized water, provide a fine disbursement of rinsing fluid.

While not being limited to any particular performance indicator or diagnostic identifier, preferred embodiments of the invention can be identified one at a time by testing for the presence of a substantially uniform develop rate across the surface of a wafer. The test for the presence of a substantially uniform develop rate can be carried out without undue experimentation by the use of the simple and conventional IPEC Awmap rate map or spinning rate test.

A spinning rate test was performed to determine how much offset between the center of a spinning wafer and the nearest develop stream could be tolerated during developer dispense. The criteria used was to increase offset until the develop uniformity suffered. This is important to know as such an offset is inherent in most of the dispense nozzle designs being considered for the develop module.

FIGS. 15-18 provide results of a develop test on wafers with nozzle offsets of 0, 5, 10 and 20 mm at the same time while varying the spin during dispense between 60 and 2500 rpm. The test found that an offset at least as great as 5 mm had no adverse impact on develop uniformity across the wafer. Presumably a nozzle design with an offset of 5 mm or less should not cause develop non-uniformity at the center of the wafer. At some point between 5 and 10 mm, fluid no longer wets the center of the wafer and develop there is greatly suppressed. The spin speed of the wafer interacts with the offset somewhat, and is most apparent at the marginal offset of 10 mm.

A preferred embodiment of the invention includes three parallel rows of holes in a bar one wafer radius long. This single nozzle would dispense both deionized (DI) water and developer. Since the radial position of the arm over the wafer is done with a pneumatic cylinder, there will be only one placement of the nozzle relative to the wafer, regardless of which fluid is dispensed. Therefore, only one set of holes can be exactly over the center of the wafer, and it is expected that DI dispense should take precedence in which fluid gets to be closest to the wafer center. The typical develop process dispenses fluid on a spinning wafer, so centrifugal force will prevent fluid from reaching the center if it is dispensed too far out. This test was performed to determine how far off-center the develop dispense could be before develop rate uniformity across the wafer was affected.

Developer was dispensed at fixed offsets of 0, 5, 10 and 20 mm from the center. Initial spin during the dispense was also varied, as the difference in centrifugal force could interact with the centering offset to affect developer reaching the center of the wafer. Speeds of 60, 600, 1200 (standard), and 2500 rpm were used.

Referring to FIGS. 19A-22D, a sub-develop technique was chosen as a measure of develop quality for several reasons, including: (1) sub-develop technique is fast relative to line width measurements; (2) sub-develop technique has more resolution that line width or $E°$ measurement, and is less subjective than $E°$ measurement; (3) the entire wafer area can be used, as opposed to a few discrete locations; and (4) with exposures and develop rates well above those for $E°$, the effect of the develop process is much more dominant compared to the contributors to develop rate, such as the swing curve, Microscan intensity uniformity, PEB uniformity, etc. As the resist film approaches complete deprotection, development trends toward a simple etch process. In addition to the qualitative measure of color uniformity across the wafer after development, resist removal differences across the wafer were quantified with IPEC Acumap thickness measurement system. Although this tool measures thickness at 1 mm intervals across the entire wafer (greater than 30,000 locations), as a practical matter only the thickness at the center of 121 exposure fields were used for the calculations in this report.

The baseline chemistry, TOK9, and process were used for the test. The develop recipe was modified to remove arm movement during develop and DI dispenses. A preferred embodiment of the nozzle was used for develop dispense. It was adjusted so the centermost hole was over the center of the wafer with 0 offset in the arm program. The puddle portion of the development process was shortened from 60.5 to 5.5 seconds. The exposure dose used was 12 mJ/cm. ($E°$ dose is approximately 6.5-7.0 mJ/cm). The developer flowmeter was set to approximately 3.8, and although volume was not checked, past experience with this meter is that it should be about 50 ml. All wafers were processed at one time through PEB, then separately into the developer, where parameters were varied for each wafer in randomized order.

Develop rates were determined by first subtracting the resist thickness at the 121 locations after develop from the thickness measured on two of the wafers after PEB, just prior to develop. In this approach, it was assumed that wafer-wafer differences in pre-develop thickness were relatively negligible, and a representative wafer could be the "before" wafer for all rate calculations. The resist removed was divided by the develop time (dispense+puddle+refresh), 10 seconds for all wafers in this test.

Measuring initial thickness between PEB and develop is notable for two reasons. First, many of the prior develop rate calculations have been done using the thickness before exposure. Since the thickness loss was about 1000 Å from the original 8500 Å, this should be a more accurate estimate of the develop rate. Second, the exposed areas were clearly visible, and a characteristic pattern across the wafer was seen on every wafer. This is useful as a metric of relative deprotection across the wafer, and some papers have also noted this. It has the desirable property of being independent of the develop process.

The develop portion of the recipe used is as follows:

| Operation | Time (sec.) | Speed (rpm) | Arm X (mm) |
|---|---|---|---|
| Spin | 1.0 | 60-2500 | 0-20 |
| Develop Dispense | 1.0 | Same | Same |
| Develop Dispense | 2.0 | 20 | Same |
| Spin | 6.5 | 0 | Same |
| Spin | 0.5 | 1200 | Same |
| /// | | | |
| /// | | | |
| /// | | | |

Results for this test are summarized in the table below:

Overall, the clear break in the data is between 5 and 10 mm offset. Five may be slightly better than 0; 20 is the worst. The primary effect is the arm position, but the spin speed during dispense can be seen, particularly for the 10 mm offset. Predictably, the single point at the center is responsible for much of the non-uniformity especially for 10 and 20 mm. To capture the variation between the center and the rest of the wafer, the range is a more useful measure of uniformity here than is standard deviation, where the other 120 points tend to dilute the center.

A third order polynomial line is fitted through the data to ease comparison between the different spin speeds, as there is quite a bit of scatter in the data FIGS. 15-18 confirm the trends seen in the tables: the primary non-uniformity is between the center and the rest of the data for the higher speeds, 0 and 5 mm are clearly more uniform than the higher offsets, and at 10 mm there is an interaction between offset and speed.

FIGS. 19A-22D show the IPEC maps for all the wafers, except for one repetition. (The maps look much better on a monitor that a printout. The monitor also has the advantage of being able to zoom in.). The rate range spanning the different colors is held constant so that relative uniformity can be compared between wafers. The gray and white areas are off the scale. It can be see here, as was apparent visually on the wafers as well, that starting with 10 mm offset, a "hole" forms in the center where little or no develop fluid contacts the wafer, and which has a much lower develop rate.

| Arm X Mm | Speed rpm | Ave. Rate Å/sec. | Stdev. Rate Å/sec. | % unif (σ/ave) | % unif (mg/ave) | Max. Rate Å/sec. | Min. Rate Å/sec. | Range Rate Å/sec. |
|---|---|---|---|---|---|---|---|---|
| | | | Each row below corresponds to individual wafers | | | | | |
| 0 | 60 | 610.9 | 28.2 | 4.6% | 20.5% | 679.8 | 554.6 | 125.2 |
| 0 | 600 | 639.3 | 2406 | 3.8% | 16.6% | 698.7 | 592.6 | 106.1 |
| 0 | 1200 | 608.9 | 21.9 | 3.6% | 14.4% | 660.7 | 572.8 | 87.9 |
| 0 | 1200 | 611.2 | 24.1 | 3.9% | 17.6% | 677.0 | 569.6 | 107.4 |
| 0 | 2500 | 646.6 | 26.4 | 4.1% | 20.6% | 728.3 | 595.1 | 133.2 |
| 5 | 60 | 610.0 | 31.1 | 5.1% | 20.6% | 685.7 | 560.3 | 125.4 |
| 5 | 600 | 622.7 | 28.9 | 4.6% | 20.8% | 707.1 | 577.8 | 129.3 |
| 5 | 1200 | 638.8 | 24.4 | 3.8% | 16.8% | 698.0 | 590.8 | 107.2 |
| 5 | 2500 | 647.7 | 23.4 | 3.6% | 17.1% | 711.9 | 600.8 | 111.1 |
| 10 | 60 | 582.6 | 29.2 | 5.0% | 21.1% | 656.3 | 533.6 | 122.7 |
| 10 | 600 | 639.9 | 25.9 | 4.0% | 20.2% | 724.3 | 595.1 | 129.2 |
| 10 | 1200 | 606.3 | 30.7 | 5.1% | 42.0% | 690.4 | 435.9 | 254.5 |
| 10 | 2500 | 639.8 | 32.7 | 5.1% | 46.7% | 712.4 | 413.4 | 299.0 |
| 20 | 60 | 607.9 | 63.8 | 10.5% | 112.9% | 686.8 | 0.7 | 686.1 |
| 20 | 600 | 593.8 | 60.0 | 10.1% | 113.4% | 672.5 | −1.0 | 673.4 |
| 20 | 1200 | 629.4 | 66.6 | 10.6% | 114.9% | 723.1 | −0.3 | 723.4 |
| 20 | 2500 | 639.0 | 64.9 | 10.2% | 112.0% | 717.1 | 1.2 | 716.0 |
| | | rows below group previous data by either arm position or spin speed | | | | | | |
| All | 60 | 602.8 | 42.4 | 7.0% | 113.8% | 686.8 | 0.7 | 686.1 |
| All | 600 | 623.9 | 42.1 | 6.7% | 116.2% | 724.3 | −1.0 | 725.2 |
| All | 1200 | 618.9 | 39.5 | 6.4% | 116.9% | 723.1 | −0.3 | 723.4 |
| All | 2500 | 643.3 | 40.4 | 6.3% | 113.0% | 728.3 | 1.2 | 727.2 |
| 0 | all | 623.4 | 29.8 | 4.8% | 27.9% | 728.3 | 554.6 | 173.7 |
| 5 | all | 629.8 | 30.7 | 4.9% | 24.1% | 711.9 | 560.3 | 151.6 |
| 10 | all | 617.2 | 38.3 | 6.2% | 50.4% | 724.3 | 413.4 | 310.9 |
| 20 | all | 617.5 | 66.1 | 10.7% | 117.2% | 723.1 | −1.0 | 724.1 |
| | | Rows below are grouped as in previous section; but with center data point removed | | | | | | |
| All | 60 | 604.1 | 32.4 | 5.4% | 30.1% | 686.6 | 505.0 | 181.8 |
| All | 600 | 625.1 | 30.8 | 4.9% | 37.8% | 724.3 | 487.7 | 236.6 |
| All | 1200 | 620.3 | 29.6 | 4.8% | 33.7% | 723.1 | 513.9 | 209.2 |
| All | 2500 | 645.1 | 26.0 | 4.0% | 33.2% | 728.3 | 514.0 | 214.3 |
| 0 | all | 623.4 | 29.9 | 4.8% | 27.9% | 728.3 | 554.6 | 173.7 |
| 5 | all | 629.9 | 30.8 | 4.9% | 24.1% | 711.9 | 560.3 | 151.6 |
| 10 | all | 617.9 | 35.9 | 5.8% | 30.9% | 724.3 | 533.6 | 190.7 |
| 20 | all | 622.7 | 34.6 | 5.6% | 37.8% | 723.1 | 487.7 | 235.4 |

The test confirmed that some offset from the center is tolerable for developer dispense, at least up to 5 mm. At some point between 5 and 10 mm offset from the center and the nearest develop stream, fluid ceases to contact the center of the wafer, resulting in an area with greatly suppressed develop rate, and no doubt catastrophic yield loss on a customer wafer. Larger offsets exacerbate the effect. There is a mild interaction with the spin speed used as the fluid first touches the wafer, showing up mainly at the apparently marginal condition of a 10 mm offset. The uniformities measured were actually slightly better for the 5 mm offset than for 0, but it is probably not a significant difference in this test.

These results indicate that said nozzle design should not cause develop rate non-uniformities at the center of the wafer so long as the centermost stream is not more than 5 mm from the center.

ADVANTAGES OF THE INVENTION

A process and/or nozzle, representing an embodiment of the invention, can be cost effective and advantageous for at least the following reasons. This invention improves the CD control capability of the developer fluid module. This invention reduces defects and particles during the develop process thereby improving the yield of the final devices. This invention combines low impingement force nozzle for both develop and rinse parts of the process and minimizes the impinging force on the features which are being developed, which in turn, minimizes the pattern collapsing, thus improving device yields. This invention has wide process latitude and reduced sensitivity to process variables. This invention includes improved rinsing action which reduces the total develop process time, thus increasing the throughput. The advantages of the nozzle include the enablement of an all-in-one design: three rows of holes for two developer chemistries and one row of holes for deionized water chemistry in a single head, if needed. The advantages of the nozzle include a compact design, for example, a nozzle width of only 1½ inches for a triple head. The advantages of the nozzle include low cost. The advantages of the nozzle include a one piece body design that is easy to manufacture. The advantages of the nozzle include tube inserts with smooth inner surfaces for improved particle performance.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Further, although the multiport nozzle described herein can be a physically separate module, it will be manifest that the multiport nozzle may be integrated into the apparatus with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A method for minimizing precipitation of developing reactant, said method comprising:
   providing a laminar airflow field in a developer fluid module in which a substrate is located;
   applying a charge of a developer fluid onto a polymer layer on the substrate;
   developing at least a portion of the polymer layer with the developer fluid;
   rinsing said polymer layer with an additional charge of said developer fluid so as to controllably minimize a subsequent sudden change in PH; and then
   rinsing said polymer layer with a rinse fluid having a fluid chemistry different from the developer fluid.

2. The method of claim 1 wherein rinsing said polymer layer with rinse fluid includes rinsing said polymer layer with deionized water dispensed in a fine disbursement.

3. The method of claim 1 wherein the developer fluid is applied at a plurality of locations on the surface of the polymer layer.

4. The method of claim 1 wherein developing at least said portion of said polymer on said substrate includes developing at least a portion of an exposed photoresist polymer on said substrate.

5. The method of claim 1 wherein developing at least a portion of said polymer on said substrate includes developing at least a portion of said polymer on a semiconductor wafer substrate.

6. The method of claim 1 wherein the developer fluid and the rinse fluid are applied with a low impinging force, so as to reduce damage to the patterned polymer layer.

* * * * *